(12) United States Patent
Enriquez Shibayama et al.

(10) Patent No.: US 9,955,605 B2
(45) Date of Patent: Apr. 24, 2018

(54) HARDWARE INTERFACE WITH SPACE-EFFICIENT CELL PATTERN

(71) Applicant: Intel Corporation, Santa Clara, CA (US)

(72) Inventors: Raul Enriquez Shibayama, Zapopan (MX); Karen Navarro Castillo, Tlaquepaque (MX); Casey G Thielen, Gilbert, AZ (US); Alfredo Cueva Gonzalez, Zapopan (MX); Benjamin Lopez Garcia, Puebla (MX)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/085,951

(22) Filed: Mar. 30, 2016

(65) Prior Publication Data

US 2017/0288327 A1    Oct. 5, 2017

(51) Int. Cl.
*H01R 12/70* (2011.01)
*H05K 7/10* (2006.01)
*H05K 1/11* (2006.01)
*H01R 43/20* (2006.01)
*H01R 13/6471* (2011.01)

(52) U.S. Cl.
CPC ........ *H05K 7/1061* (2013.01); *H01L 2924/00* (2013.01); *H01R 12/7076* (2013.01); *H01R 13/6471* (2013.01); *H01R 43/205* (2013.01); *H05K 1/111* (2013.01)

(58) Field of Classification Search
CPC .............. H01R 12/7076; H01R 43/205; H01R 13/6471; H05K 7/10; H05K 1/111; H01L 2924/00; H01L 23/49838
See application file for complete search history.

(56) References Cited

U.S. PATENT DOCUMENTS

| 4,994,902 A * | 2/1991 | Okahashi | .......... H01L 23/49811 257/665 |
| 6,285,079 B1 * | 9/2001 | Kunikiyo | ............ H01L 23/3114 257/737 |
| 6,323,559 B1 * | 11/2001 | Chan | ....................... H01L 23/50 257/778 |

(Continued)

OTHER PUBLICATIONS

International Search Report and Written Opinion from PCT/US2017/017025 dated May 29, 2017, 13 pgs.

*Primary Examiner* — James Wu
(74) *Attorney, Agent, or Firm* — Womble Bond Dickinson (US) LLP

(57) ABSTRACT

Techniques and mechanisms for providing connectivity to an integrated circuit device via a hardware interface. In an embodiment, the hardware interface includes contacts forming an array of nodes. Some or all such nodes are arranged in cells, wherein the respective node types of each cell's nodes are according to the same cell pattern. The cell pattern includes eight B nodes for the exchange of data bits, four strobe S nodes for the exchange of strobe signals, and ground (G) nodes for the providing of one or more reference potentials. The cell pattern enables formation of a lattice structure including node-contiguous G nodes each of a respective one of the multiple cells. In another embodiment, a ratio of bi-level nodes (including all S nodes and all G nodes) of the cell pattern to a total number of G nodes of the cell pattern is 12:8 or more.

18 Claims, 10 Drawing Sheets

(56) References Cited

U.S. PATENT DOCUMENTS

| | | | | |
|---|---|---|---|---|
| 6,479,758 B1* | 11/2002 | Arima | H01L 23/49838 | 174/260 |
| 6,641,411 B1* | 11/2003 | Stoddard | H01L 23/49838 | 257/E23.07 |
| 6,768,206 B2* | 7/2004 | Hosomi | H01L 23/49827 | 257/773 |
| 7,335,995 B2* | 2/2008 | Pflughaupt | H01L 23/50 | 257/777 |
| 7,442,054 B2* | 10/2008 | Lemke | H01R 29/00 | 439/79 |
| 7,514,789 B1* | 4/2009 | Tao | H01L 23/49838 | 257/659 |
| 8,188,594 B2* | 5/2012 | Ganesan | H01L 23/367 | 257/675 |
| 8,319,345 B2* | 11/2012 | Abe | H01L 23/481 | 257/730 |
| 8,338,948 B2* | 12/2012 | Weekly | H01L 23/50 | 257/738 |
| 9,030,021 B2* | 5/2015 | Song | H01L 23/49827 | 257/737 |
| 9,226,398 B1* | 12/2015 | Goss | H05K 1/111 | |
| 9,543,241 B2* | 1/2017 | Chen | H01P 3/026 | |
| 2003/0089982 A1* | 5/2003 | Feurle | H05K 1/181 | 257/734 |
| 2005/0186769 A1* | 8/2005 | Young | H01L 23/49816 | 438/612 |
| 2006/0118929 A1 | 6/2006 | Ramakrishnan et al. | | |
| 2006/0192282 A1 | 8/2006 | Suwa et al. | | |
| 2007/0269998 A1* | 11/2007 | Daly | H01R 43/0249 | 439/70 |
| 2011/0192640 A1* | 8/2011 | Liu | H01L 23/49838 | 174/261 |
| 2013/0015590 A1* | 1/2013 | Haba | H01L 25/0652 | 257/778 |
| 2013/0048364 A1 | 2/2013 | Shiu et al. | | |
| 2013/0082389 A1 | 4/2013 | Crisp et al. | | |
| 2014/0197899 A1* | 7/2014 | Kawai | H01P 3/08 | 333/5 |

\* cited by examiner

| | Row-Column span 510 | Ratio [S+B]:[G] 520 | Total nodes 530 | S-B node pairs 540 | S-B node pair density 550 |
|---|---|---|---|---|---|
| Pattern 400 | (6 × 4) = 24 | 12:8 | 20 | 12 | (12 ÷ 20) = 0.6 |
| Pattern 420 | (5 × 6) = 30 | 12:8 | 20 | 12 | (12 ÷ 20) = 0.6 |
| Pattern 440 | (5 × 4) = 20 | 12:7 | 19 | 14 | (14 ÷ 19) = 0.7368 |

HARDWARE INTERFACE WITH SPACE-EFFICIENT CELL PATTERN

BACKGROUND

1. Technical Field

Embodiments discussed herein relate generally to packaged integrated circuit (IC) devices and more particularly, but not exclusively, to structures for providing connection with an IC chip.

2. Background Art

Dual data-rate (DDR) memory is one type of synchronized dynamic random access memory (DRAM) that supports data transfers on both edges of each clock cycle (the rising and falling edges), thereby effectively doubling the memory chip's data throughput. DDR memory consumes less power than conventional or single data-rate (SDR) memory, which makes it popular and well-suited for a wide variety of applications.

In a typical DDR memory, the memory array is arranged in multiple ranks. A rank typically contains between four (4) and eighteen (18) unique DDR memory components. When a READ tenure is initiated to read data from a DDR memory component, the DDR memory uses a source-synchronous data strobe signal to deliver the data from the DDR memory component to the memory controller hub (MCH). That is, each DDR component has its own data strobe signal where the synchronization is provided by the individual memory module rather than the system clock of the MCH.

As successive generations of integrated circuit technologies continue to trend toward smaller size, lower power usage, and faster signaling rates, there is expected to be an increasing premium placed on space-efficient hardware interfaces that provide robust protection of signal integrity for high-speed communication. This is particularly true for signaling, such as that provided in DDR systems, to communicate data bits and corresponding strobe signaling.

BRIEF DESCRIPTION OF THE DRAWINGS

The various embodiments of the present invention are illustrated by way of example, and not by way of limitation, in the figures of the accompanying drawings and in which:

FIG. 5 is a table showing the features of various hardware interface cell patterns each according to a corresponding embodiment.

DETAILED DESCRIPTION

Figure 1:
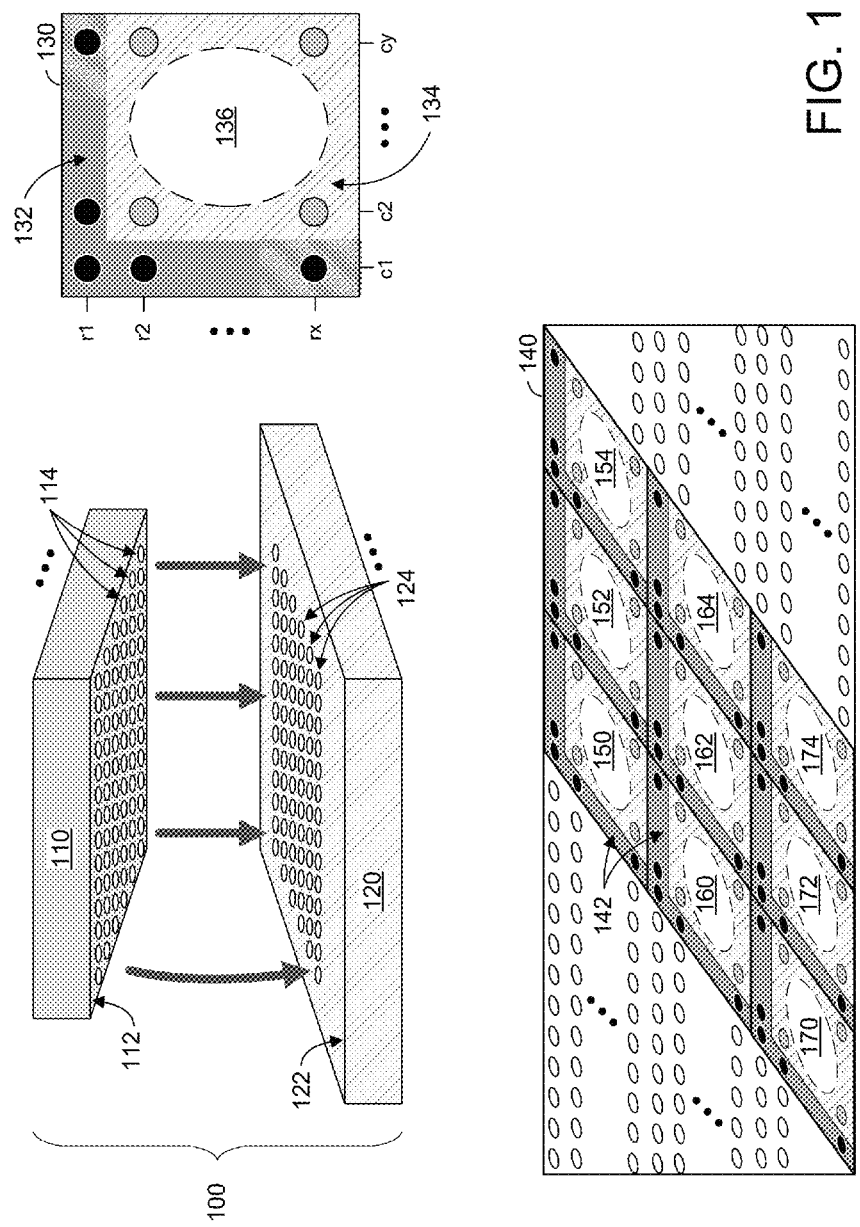
FIG. 1 is an exploded view of a system including hardware interface structures according to one embodiment.

Embodiments discussed herein variously provide techniques and mechanisms for providing connection with an integrated circuit (IC) device via a hardware interface with an improved arrangement of conductive contacts. The IC device may include an IC chip or, for example, a packaged device including one or more IC chips. The hardware interface may be a component of the IC device or, alternatively, a structure that is configured to couple to such an IC device. For example, the hardware interface may be part of a printed circuit board that is to couple—via the hardware interface—to one or more IC devices. In an embodiment, a hardware interface may couple one or more IC chips, directly or indirectly, with a bus of a high bandwidth memory (HBM), DDR memory and/or other system that is compatible with a memory standard. Certain features of various embodiments are described herein with reference to a hardware interface that enables coupling of an IC device that is configured to operate as a part of a DDR memory system. However, such description may be extended to additionally or alternatively apply to any of a variety of other types of IC devices.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including integrated circuitry configured to communicate, via a hardware interface, data bits and strobe signals associated with such data bits.

Certain embodiments variously provide for an arrangement of structures of a hardware interface, the arrangement to facilitate space-efficiency and to promote the integrity of signals exchanged via the hardware interface. A hardware interface includes conductive contacts (or, for brevity, simply "contacts") each coupled to provide—to and/or from an IC device—a respective signal or a respective voltage. Contacts of a hardware interface may include, for example, one or more pins, pads, bumps, balls, socket holes or other conductive input and/or output (I/O) structures. Such contacts may include solder, copper and/or any of a variety of other metals (e.g., including alloys) used in conventional hardware interface structures. "Array" is used herein to refer to a column-and-row arrangement of some or all contacts of a hardware interface—e.g., where such contacts are each a different respective node of the array. Accordingly, "node" is also used herein to refer to a conductive contact of a hardware interface.

An array of a hardware interface may include nodes that are each of a different respective node type. The node type of a given node may be based on to whether that node is coupled to provide a particular type of signal or, alternatively, a particular type of reference potential (e.g., a ground) or other voltage. In an embodiment, a hardware interface includes nodes of a first node type (referred to herein as a "G node type" or simply "G node") that corresponds to the providing of a ground or other reference potential. Alternatively or in addition, the hardware interface may include other nodes of a second node type (a "B node type," or simply "B node") that corresponds to the providing of a data bit signal. In some embodiments, the hardware interface further includes nodes of a third node type (an "S node type," or simply "S node") that corresponds to the providing of a strobe signal. The B node type and S node type may be considered as belonging each to "bi-level" node type, insofar as data bit signals and strobe signals may variously transition between two logical states during signal exchanges via the hardware interface.

The respective node types of different nodes may constitute a pattern formed by such nodes. For example, an array may include different groups of nodes—each such group referred to herein as a "cell"—that each include the same arrangement or nodes, by node type. Some embodiments variously provide an array including multiple cells, where respective portions of such cells each have the same node type pattern.

Certain features of such cell patterns are described herein with reference to an array comprising nodes that are variously arranged to form columns and rows. As used herein, the respective meanings of "column" and "row" relate in part to node periodicity—i.e., an average periodicity of nodes along a straight line. A given direction may correspond to a particular node periodicity insofar as, for some line extending through the array in parallel with that direction, nodes located along that line have the corresponding node periodicity. For example, columns of an array may each extend in parallel with a first direction corresponding to a first node periodicity, wherein rows of the array each extend in parallel with a second direction corresponding to a second node periodicity. For the sake of describing features of a cell pattern or an array, "column" refers herein to a line of nodes extending in parallel with a direction corresponding to a smallest (shortest) node periodicity for any line through the array. "Row" refers herein to a line of nodes extending in parallel with another direction corresponding to a node periodicity that is equal to the smallest node periodicity, or equal to a second smallest node periodicity for any line through the array. A particular node of a cell pattern (or of an array) may be referred to using the indexing convention (x, y), wherein x is an identifier of a row which includes that node, and y is an identifier of a column that includes that node.

A cell pattern according to some embodiments provides for an efficient hardware interface layout to improve signal integrity. The integrity of a signal exchanged by one node can be affected by electromagnetic interaction which is due at least in part to other signaling that is exchanged concurrently by a different node. The effect of such interaction tends to be significant when there is a particular type of relative configuration of such nodes. For brevity, this type of relative configuration is referred to herein as "node-adjacency." Two nodes are "node-adjacent" when a line segment, extending between respective centers of the two nodes, does not intersect any other node and does not intersect any shorter line segment that extends between the respective centers of two other nodes. A periodicity of two node-adjacent nodes may be equal to a shortest node periodicity for any line through the array. In some embodiments, a periodicity of two node-adjacent nodes may be equal to one of a shortest node periodicity for any line through the array and a second shortest node periodicity for any line through the array. For example, a periodicity of two node-adjacent nodes may be equal to one of a node periodicity of a row and a node periodicity of a column. The term "row-wise node-adjacent" refers to node-adjacent nodes that are in the same row of an array. "Column-wise node-adjacent" refers to node-adjacent nodes that are in the same column of an array. A group of multiple nodes is "node-contiguous" where each node of the group is node-adjacent with at least one other node of the group.

FIG. 1 is an exploded view illustrating elements of a system 100 to provide connection between an IC device and a substrate according to an embodiment. System 100 may include a processing-capable platform and/or provide functionality to operate as a component of such a platform. In the illustrative embodiment shown, system 100 includes an IC device 110 and a substrate 120 to be coupled thereto. Some embodiments are implemented entirely by IC device 110, and other embodiments entirely by another device including substrate 120—e.g., independent of whether IC device 110 and substrate 120 might be coupled to one another.

Device 110 may be an IC chip that, for example, is to couple to another IC chip which includes, or is coupled to, substrate 120. For example, substrate 120 may function as at least part of an interposer of a packaged IC device which includes both IC chip 110 and one or more other IC chips. In such an embodiment, system 100 may be a packaged IC device—e.g., including IC chips arranged in a side-by-side configuration.

Alternatively, IC device 110 may itself be a packaged device that is to couple to external circuitry via substrate 120. For example, substrate 120 may be a main body portion of a motherboard, or other PCB, including any of a variety of substrate materials and/or structures suitable to support coupling to, and operation with, one or more packaged IC devices. For example, materials used in conventional PCB manufacture techniques may be adapted to fabricate substrate 120—e.g., where such materials include, but are not limited to, any of various FR4 materials, composite epoxy materials (such as CEM-3), epoxy resins, polyimides, triazine resins and/or the like. Substrate 120 may have disposed therein one or more vias, traces, metallization layers and/or other interconnect structures (not shown) to enable connection between device 110 and components (not shown) variously disposed in or on substrate 120.

In one embodiment, a hardware interface of substrate 120 includes conductive contacts 124, some or all of which are arranged in an array on a side 122 to which IC device 110 is to couple. A hardware interface of IC device 110 may comprise a plurality of contacts 114, at an opposing side 112, that correspond to the plurality of contacts 124. For example, plurality of contacts 114 may be capable of alignment for coupling each to a respective one for the plurality of contacts 124. The particular type, number and arrangement of the plurality of contacts 124—as well as the type, number and arrangement of the plurality of contacts 114—is merely illustrative. In other embodiments, one or both hardware interfaces may include respective contacts that are fewer or greater in number and/or differently arranged.

Some or all of contacts 112—or, similarly, some or all of contacts 124—may form an array including multiple cells of nodes, wherein, for each of the multiple cells, some or all nodes of the cell are arranged according to a cell pattern that is common to each of those multiple cells. Such a cell pattern may facilitate space-efficiency and/or signaling bandwidth of the hardware interface. Alternatively or in addition, such a cell pattern may facilitate the process hardware interface design (e.g., redesign).

Cell patterns, according to some embodiments, variously enable the formation in an array of a lattice structure including respective G nodes of multiple cells. Such a lattice structure may variously surround, and isolate from each other, different respective node-contiguous groups (or "islands") of bi-level nodes, each such group/island belonging to a different respective cell. The inclusion of such a lattice structure may aid in mitigating signal degradation that might otherwise result from a proximity of many bi-level nodes—and/or differently-timed bi-level nodes—to one another. Alternatively or in addition, such a lattice structure may promote faster and/or more flexible design of a hardware interface layout. For example, the breakout needed for signal lines, the number of required contacts of a particular type (e.g., power pins) and/or other design constraints may change with successive generations of IC technologies. In variously enabling arrangement of G nodes in a lattice configuration, cell patterns according to different embodiments facilitate the interface redesign process—e.g., by allowing for islands of bi-level nodes to be readily shifted, swapped and/or otherwise moved in an interface layout. Some embodiments further improve on cell pattern design by providing a small total number of nodes and/or improved intra-cell signal interference characteristics.

Insets 130, 140 of FIG. 1 variously illustrate, conceptually, the formation of a lattice structure with G nodes of cells in an array—e.g., wherein at least a portion of each such cell has a common cell pattern. Inset 130 shows a generic representation of a cell pattern to provide such a lattice structure. The actual layout of nodes in such a cell pattern may, in various embodiments, have different and/or additional characteristic to that shown in inset 130.

In inset 130, the cell pattern includes nodes which span a sequence of adjacent rows r1, r2, . . . , rx and which further span a sequence of adjacent columns c1, c2, . . . , cy. The cell pattern includes a region 132 including node-contiguous G nodes (i.e., nodes that are of a G node type). The cell pattern further comprises one or more regions 136 each including respective node-contiguous S nodes (nodes that are of a S node type). In an embodiment, the cell pattern further comprises one or more regions 134 each including respective node-contiguous B nodes (nodes that are of a B node type). As described in further detail herein, the particular locations of G type, S type and B type nodes in various rows and/or columns of a cell pattern may vary according to different embodiments. For example, although the rows and columns shown in inset 130 are arranged in a rectilinear configuration, certain embodiments are not limited in this regard. Moreover, although the cell pattern is shown in inset 130 as spanning rows r1-rx, and further spanning columns c1-cy, the cell pattern itself may occupy only a subset of all nodes that are in the range r1 to rx and in the range c1 to cy. For example, region 132 may extend only partially between rows r1 to rx and/or only partially between columns c1 to cy.

As shown in inset 140, a hardware interface—e.g., including contacts 114 or contacts 124—may include multiple instances of cells each having the same pattern of node types. The cells may include, for example, some or all of a first row-wise sequence of adjoining cells 150, 152, 154, a second row-wise sequence of adjoining cells 160, 162, 164, and a third row-wise sequence of adjoining cells 170, 172, 174. The arrangement of such cells relative to each other, and the pattern of such cells, may contribute to the formation of a lattice structure 142 including node-contiguous G nodes of the cells. Lattice structure 142 may variously encircle, and isolate from one another, some or all of the cells' respective node-contiguous groups of bi-level nodes. For example lattice structure 142 may encircle the S nodes and B nodes of cell 162, providing isolation of such bi-level nodes from the respective bi-level nodes in adjoining cells.

Figure 2:
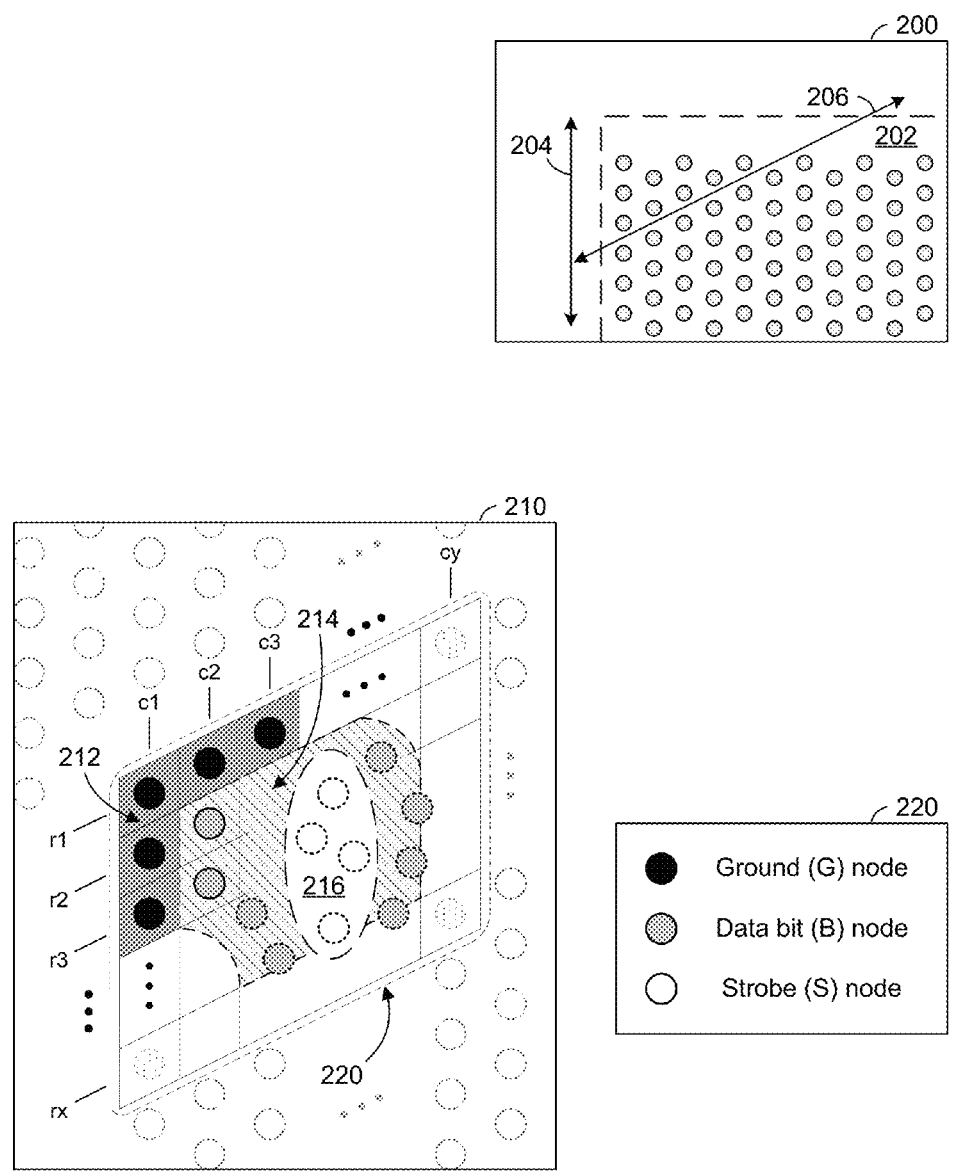
FIG. 2 is a plan view of a device including a hardware interface according to an embodiment.

FIG. 2 illustrates elements of a device 200 including interface structures having a cell pattern according to an embodiment. Device 200 may have one or more features of system 100—e.g., where device 200 includes IC device 110 and/or substrate 120. Device 200 includes a hardware interface 202 including contacts arranged in columns and rows. In the illustrative embodiment shown, columns of the array extend in parallel with a line of direction 204, and rows of the array extend in parallel with a line of direction 206. The particular lines of direction 204, 206 shown, and the respective distances between rows and columns, are not limiting on some embodiments. For example, a cell pattern according to one embodiment may be a reflection and/or a rotation of a cell pattern according to another embodiment. Alternatively or in addition, lines of direction 204, 206 may intersect at any of a various other angles.

Figure 4A:
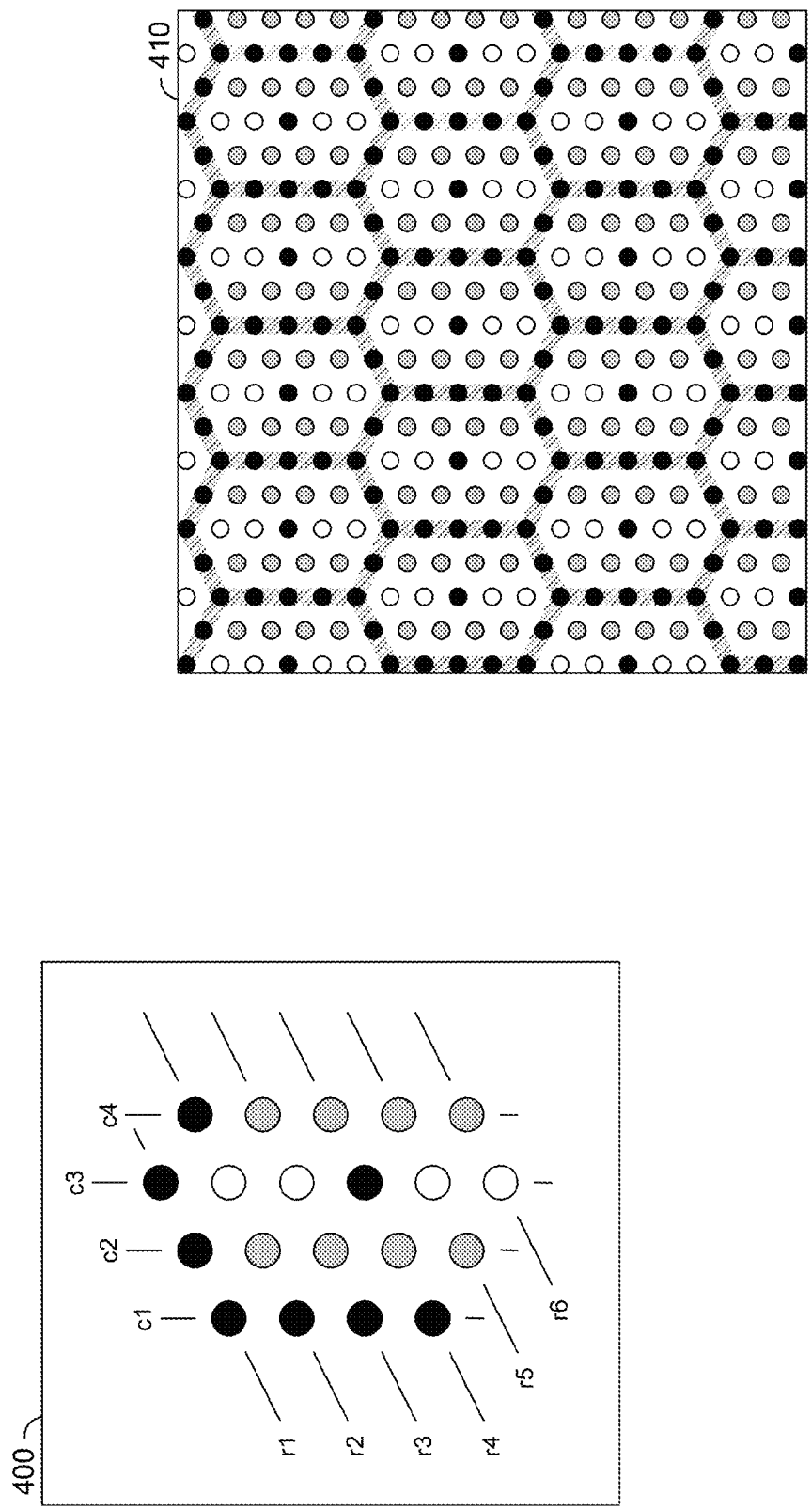
FIGS. 4A-4C are plan views showing cell patterns each of a respective hardware interface according to a corresponding embodiment.
Figure 4B:
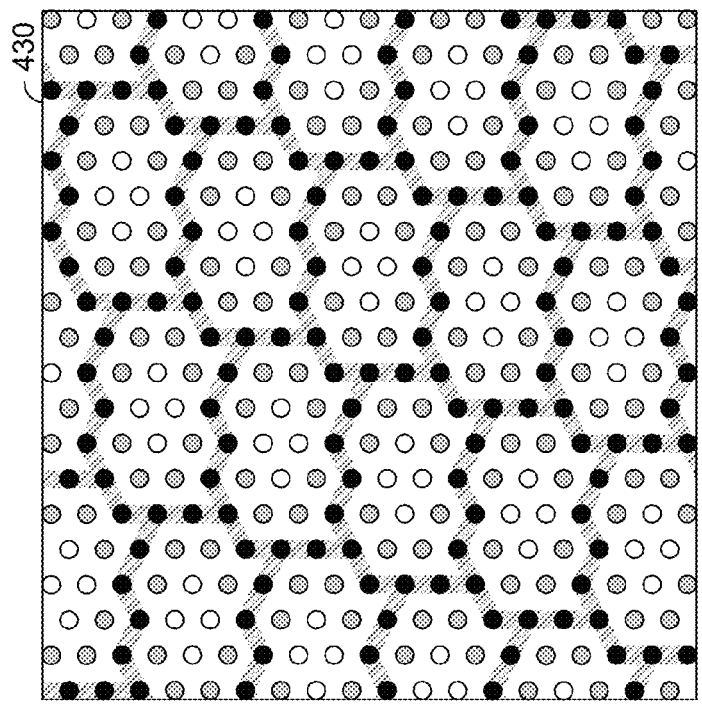
Figure 4B:
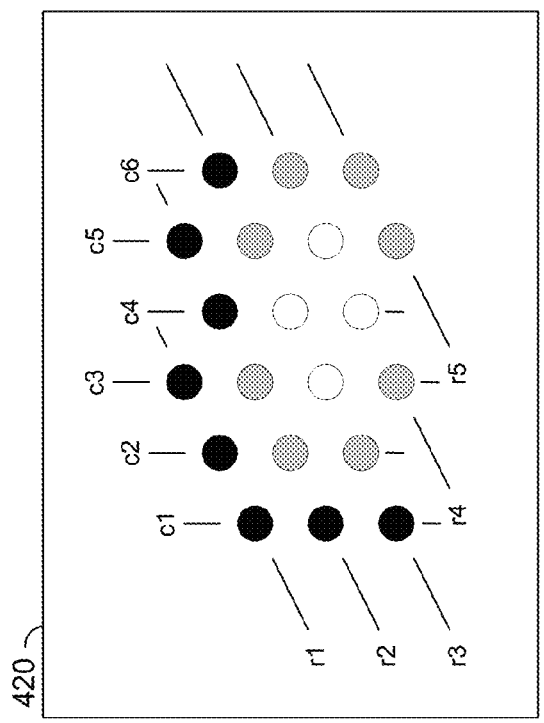
Figure 4C:
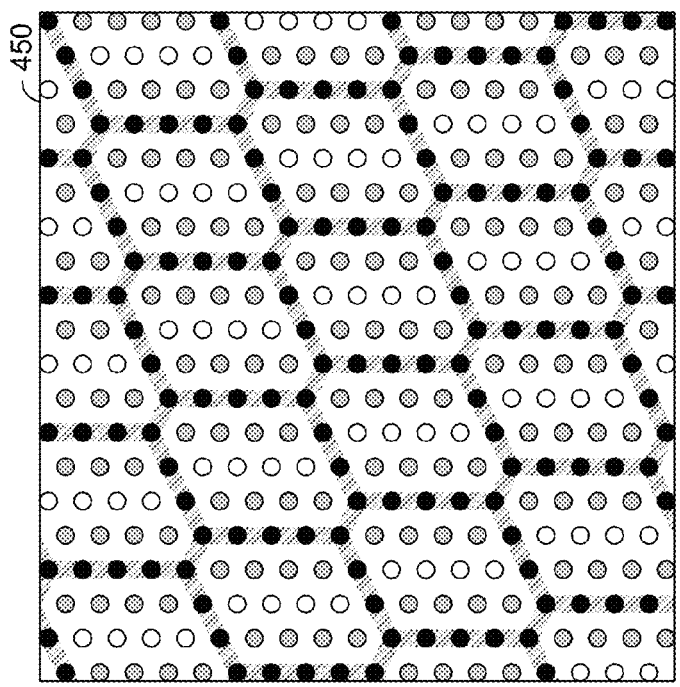
Figure 4C:
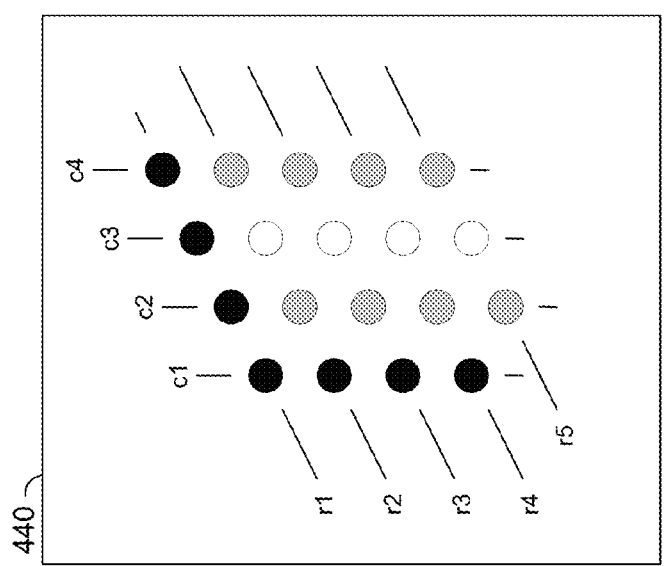

Inset 210 of FIG. 2 illustrates a generic representation of a cell pattern to provide a lattice structure (such as lattice structure 142). The actual layout of nodes in such a cell pattern may, in various embodiments, have different and/or additional characteristic to that shown in inset 210. For example, FIGS. 4A-4C show respective cell patterns 400, 420, 440 each having respective features illustrated in inset 210. Legend 220 shows shading used to variously represent G nodes, B nodes and S nodes of the cell pattern. Dashed lines are used to represent nodes which may have any of various positions, in different embodiments.

In inset 210, the cell pattern spans an area 220 including a sequence of adjacent rows r1, r2, r3, . . . , rx and a sequence of adjacent columns c1, c2, c3, . . . , cy. The cell pattern may occupy only a subset of the nodes in area 220. The cell pattern of inset 210 comprises a region 212 may include node-contiguous G nodes, a region 216 including four S nodes, and one or more regions 214 including eight B nodes. One or more regions 214 may include two constituent regions each including four respective node-contiguous B nodes—e.g., where region 216 is between such two constituent regions. Alternatively or in addition, only a subset of regions 212, 214, 216 may extend to row rx and/or only a subset of regions 212, 214, 216 may extend to column cy. In some embodiments, each B node of the cell pattern is node-adjacent to at least one S node of the cell pattern.

Region 212 may include at least three row-wise node-contiguous G nodes at one side of the cell pattern. Alternatively or in addition, region 212 may include at least three column-wise node-contiguous G nodes at another side of the cell pattern. In the embodiment illustrated by inset 210, G nodes (r1, c1), (r2, c1), (r3, c1) form a column-wise node-contiguous group of region 212, and G nodes (r1, c1), (r1, c2), (r1, c3) form a row-wise node-contiguous group of region 212.

Figure 3:
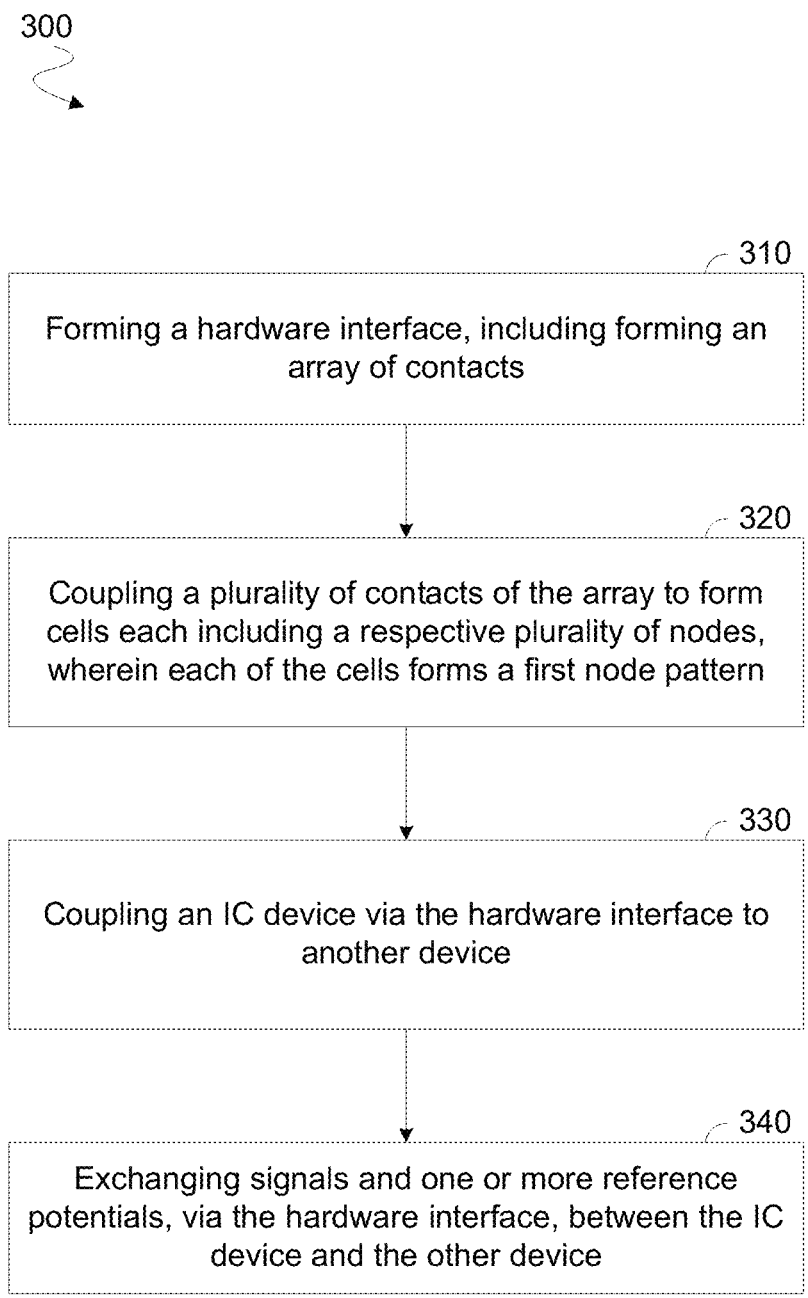
FIG. 3 is a flow diagram showing elements of a method to provide connectivity via a hardware interface according to an embodiment.

FIG. 3 illustrates elements a method 300 to provide connectivity with an IC device via a hardware interface according to an embodiment. In an embodiment, the hardware interface includes multiple cells of nodes, wherein the multiple cells each have the same cell pattern. Such a cell pattern may include features of a cell pattern shown in inset 130 or in inset 210, for example. Method 300 may include operations to make, couple and/or communicate via a hardware interface such as one including contacts 114 or, for example, contacts 124.

By way of illustration and not limitation, method 300 may include, at 310, forming a hardware interface including an array of contacts. Forming the hardware interface at 310 may include electroplating, masked deposition and/or any of a variety of other operations adapted from conventional metallization processes. In some embodiments, the forming at 310 includes fabricating contacts, directly or indirectly, on a semiconductor substrate—e.g., where such contacts are formed in or on a redistribution layer of an IC chip. In other embodiments, the forming at 310 includes depositing conductive contacts in or on a substrate such as that of an interposer, a printed circuit board or the like.

Method 300 may couple contacts of the array to form cells of nodes (e.g., each node being a respective contact) each having a respective node type. For example, method 300 may comprise, at 320, coupling a plurality of contacts of the array to form cells each including a respective plurality of nodes, wherein each of the plurality of cells forms a first node pattern. In one example embodiment, a device includes the hardware interface and circuitry operable to participate in an exchange (e.g., a unilateral exchange or a bidirectional exchange) of data bit signals and strobe signals. The circuitry may further provide and/or receive one or more reference potentials such as a ground voltage. In such an embodiment, the coupling at 320 includes forming conductive paths for the circuitry to exchange such signals and reference potentials via the hardware interface.

In some embodiments, method 300 alternatively or in additionally includes, at 330, coupling an IC device via the hardware interface to another device. The hardware interface may be a component of the IC device or the other device—e.g., wherein the other device includes an IC chip, an interposer and/or a printed circuit board. The coupling at 330 may include soldering, bumpless attachment and/or any of a variety of other operations adapted from conventional techniques for coupling an IC device.

In some embodiments, method 300 alternatively or in additionally includes, at 340, exchanging signals and one or more reference potentials, via the hardware interface, between the IC device and the other device. For example, the exchanging at 340 may include providing the one or more reference voltages with respective G nodes of multiple cells of the array. The exchanging at 340 may further comprise exchanging data bits via respective B nodes of the multiple cells, and exchanging strobe signals via a respective S nodes of the multiple cells. The B nodes of a cell may each be configured to exchange a different respective bit of the same data byte.

FIGS. 4A-4C show respective cell patterns 400, 420, 440 each for nodes of a respective hardware interface according to a corresponding embodiment. A hardware interface including one of cell patterns 400, 420, 440 may include contacts 112 or contacts 124, for example. In an embodiment, providing connectivity via such an interface may include some or all operations of method 300.

An array including cells having one of patterns 400, 420, 440 may include nodes arranged in columns and rows. Columns of the array may each extend in parallel with a first line of direction corresponding to a first node periodicity—e.g., wherein rows of the array each extend in parallel with a second line of direction corresponding to a second node periodicity. The first node periodicity may be equal to a smallest node periodicity corresponding to any line that extends through the array. In such an embodiment, the second node periodicity may be equal to the first node periodicity or, alternatively, equal to a second smallest node periodicity corresponding to any line that extends through the array.

The cell pattern may include a node-contiguous group of G nodes that, for example, include three or more column-wise node-adjacent G nodes at a side of the cell pattern. In some embodiments, such a node-contiguous group of G nodes comprises three or more row-wise node-adjacent G nodes at a side of the cell pattern. The cell pattern may include eight B nodes and four S nodes. The eight B nodes may be arranged in two groups each comprising a node-contiguous arrangement of four respective B nodes—e.g., wherein the two groups are on opposite sides of the four S nodes. In an embodiment, each B node of the cell pattern is node-adjacent to at least one respective S node of the cell pattern.

By way of illustration and not limitation, a cell having cell pattern 400 may span a sequence of six adjacent rows r1 through r6 and further span a sequence of four adjacent columns c1 through c4. Cell pattern 400 includes node-contiguous G nodes (r1, c1), (r2, c1), (r3, c1), (r4, c1), (r1, c2), (r1, c3), (r2, c4). These G nodes may be variously disposed at respective sides of cell pattern 400—e.g., each in a left-most column c1 or, for each of the other columns, in a node position of the column that is closest to row r1. Cell pattern 400 may further include four S nodes (r2, c3), (r3, c3), (r5, c3), (r6, c3) and, in some embodiments, an additional G node (r4, c3) located in the middle thereof. Cell pattern 400 may further include a first node-contiguous group including four B nodes (r2, c2), (r3, c2), (r4, c2), (r5, c2) and a second node-contiguous group including four B nodes (r3, c4), (r4, c4), (r5, c4), (r6, c4). Inset 410 shows a tessellation pattern formed by cells each having cell pattern 400, the tessellation pattern including a lattice structure (shaded) that provides for isolation of node-contiguous groups of bi-level nodes.

In another embodiment, a cell having cell pattern 420 spans a sequence of five adjacent rows r1 through r5 and a sequence of six adjacent columns c1 through c6. Cell pattern 420 includes node-contiguous G nodes (r1, c1), (r2, c1), (r3, c1), (r1, c2), (r1, c3), (r2, c4), (r2, c5), (r3, c6). These G nodes are variously disposed at respective sides of cell pattern 420. Cell pattern 420 may further comprise a node-contiguous group of four S nodes (r3, c3), (r3, c4), (r4, c4), (r4, c5), a node-contiguous group of B nodes (r2, c2), (r3, c2), (r2, c3), (r4, c3) and another node-contiguous group of B nodes (r3, c5), (r5, c5), (r5, c6), (r4, c6). Inset 430 shows a tessellation pattern formed by cells each having cell pattern 400, the tessellation pattern including a lattice structure (shaded) that provides for isolation of node-contiguous groups of bi-level nodes.

In another embodiment, a cell having cell pattern 440 spans a sequence of five adjacent rows r1 through r5 and a sequence of four adjacent columns c1 through c4. Cell pattern 440 includes node-contiguous G nodes (r1, c1), (r2, c1), (r3, c1), (r4, c1), (r1, c2), (r1, c3), (r1, c4) each at a respective side of cell pattern 440. Cell pattern 440 may further comprise a node-contiguous group of four S nodes (r2, c3), (r3, c3), (r4, c3), (r5, c3), a node-contiguous group of B nodes (r2, c2), (r3, c2), (r4, c2), (r5, c2) and another node-contiguous group of B nodes (r2, c4), (r3, c4), (r4, c4), (r5, c4). Inset 450 shows a tessellation pattern formed by cells each having cell pattern 400, and a lattice structure (shaded) provides by the tessellation pattern.

Patterns 400, 420, 440 variously illustrate example embodiments wherein the B nodes of a cell pattern each adjoin at least one respective S node of the cell pattern. Such a cell pattern may include a node-contiguous group comprising only G nodes, S nodes and B nodes—e.g., wherein a total number of the S nodes is four (4) and a total number of the B nodes is eight (8). For a first column at a side of the cell pattern, nodes of the cell pattern that are in that column may include only G nodes. Another side of the cell may be defined at least in part by a first row. For each of the columns of the cell pattern, a respective G node may be the node of that column that is closest, column-wise, to the first row. A total number of S-B node pairs of the cell pattern may be equal to or more than twelve (12). Alternatively or in addition, a ratio of all bi-level nodes of the cell pattern to all G nodes of the cell pattern may be 12:8 or more.

FIG. 5 shows a table 500 identifying respective characteristics for each of cell patterns 400, 420, 440. Column 510 of table 500 lists a total number of nodes in a row-column span of a cell pattern. A given cell pattern may include only a subset of nodes in such a row-column span. For example, column 530 identifies a total number of nodes of a cell pattern, and column 520 identifies a breakdown of node types that comprise such a total number of nodes. More particularly, column 520 identifies, for a given cell pattern, a ratio of bi-level nodes (where each such node is either of a S node type or of a B node type) to G nodes of the cell pattern.

Column 540 of table 500 identifies a total number of S-B node pairs for a given cell pattern. As used herein, "S-B node pair" refers to a distinct combination of two node-adjacent nodes, wherein one such node is a S node and the other node is a B node. By way of illustration, cell pattern 400 includes one S-B node pair [(r2, c2), (r2, c3)] and another S-B node pair [(r3, c2), (r3, c3)]. Other S-B node pairs of cell pattern 400 include, for example, node pair [(r2, c3), (r2, c4)], node pair [(r2, c3), (r3, c4)], etc.

Column 550 of table 500 shows, for a given cell pattern, a ratio of the S-B node pairs (from column 540) to the total nodes (from column 530). The increased number of S-B node pairs—e.g., relative to the total number of nodes (and/or relative to the total number of bi-level nodes)—may correspond generally to a reduced number of nodes needed to form a tileable cell pattern that includes G nodes extending along two adjoining sides of the cell pattern. Additionally or alternatively, an increased number of S-B node pairs may generally correspond to cell pattern symmetry that mitigates at least some instances of aggressor nodes (wherein an "aggressor" node is one that adversely affects signaling by some adjacent node).

As illustrated by table 500, an array may include a plurality of cells that each have the same cell pattern, wherein, for each cell of the plurality of cells, a total number of distinct S-B node pairs is twelve (12) or more. Additionally or alternatively, a ratio of bi-level nodes (including all S nodes and all B nodes) of the cell pattern to G nodes of the cell pattern may be 12:8 or larger. In some embodiments, some or all of the plurality of cells are each to exchange a different respective byte of data—e.g., wherein the B nodes of a given cell are each configured to exchange a different respective bit of the same byte.

Some or all of the plurality of cell may be node-contiguous with one another—e.g., to form at least part of a tessellation pattern. In some embodiments, the array further includes one or more additional cells—e.g., variously located among the plurality of cell—each having a second cell pattern that is only partially congruent to a first cell pattern of the plurality of cells. For example, the first cell pattern and second cell pattern may have the same footprint, and a congruent arrangement of G nodes along the respective sides of the cell patterns. However, the second cell pattern may include a different arrangement (by node type) of its remaining nodes and/or may be agnostic as to any particular node type(s) that is/are to occupy some or all such remaining nodes. Stated differently, an array according to some embodiments may have a non-periodic or otherwise irregular arrangement of cells, only a subset of which having the same node pattern.

Figure 6:
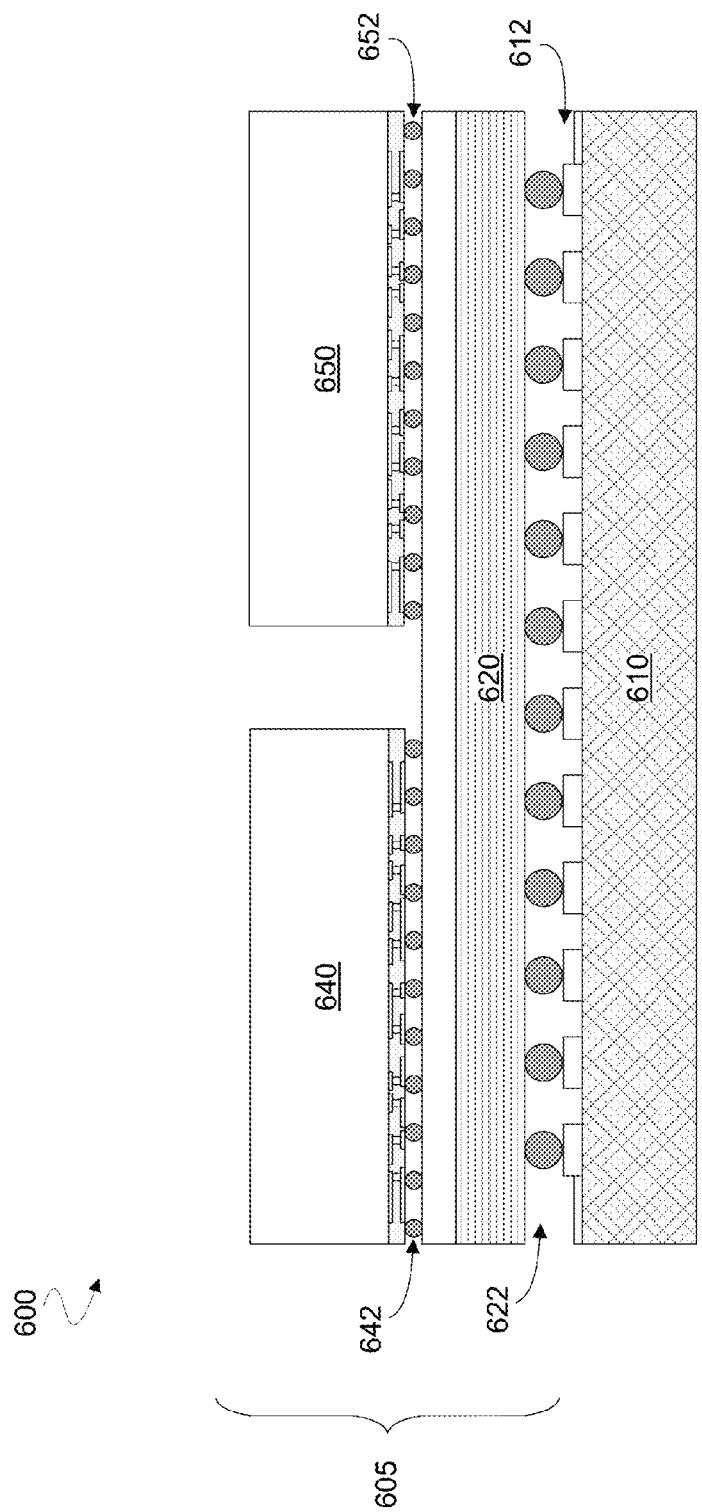
FIG. 6 is a cross-sectional diagram of a system including hardware interface structures according to an embodiment.

FIG. 6 is a cross-sectional view showing some features of a system 600 to provide interconnection with integrated circuitry via a hardware interface according to one embodiment. System 600 may include some or all of the features of one of system 100 for example. In an embodiment, processing to fabricate, assemble, operate or otherwise provide functionality of system 600 is according to method 200.

System 600 includes a packaged integrated circuit (IC) device 605 and a printed circuit board PCB 610, wherein a hardware interface 612 of PCB 610 is coupled to a hardware interface 622 (e.g., a ball grid array) of packaged IC device 605. Conductive contacts of hardware interface 622 may be variously connected, through a package mold 620 of device 605, to integrated circuitry including, for example, one or both of IC chips 640, 650. By way of illustration and not limitation, through-mold vias—not shown—and a redistribution layer (such as that of an interposer, in some embodiments) may provide interconnection between hardware interface 622 and another hardware interface 642 of IC chip 640. Alternatively or in addition, similar interconnection may be provided to a hardware interface 652 of IC chip 650 and one or both of hardware interface 622 and hardware interface 642.

Some or all of hardware interfaces 612, 622, 642, 652 may each include respective conductive contacts arranged in an array having features described herein. One or more such arrays may each include multiple cells of nodes, the arrangement of which are according to the same cell pattern. By way of illustration and not limitation, one or more of hardware interfaces 612, 622, 642, 652 may each include respective cells that are arranged according one of cell patterns 400, 420, 440.

Figure 7:
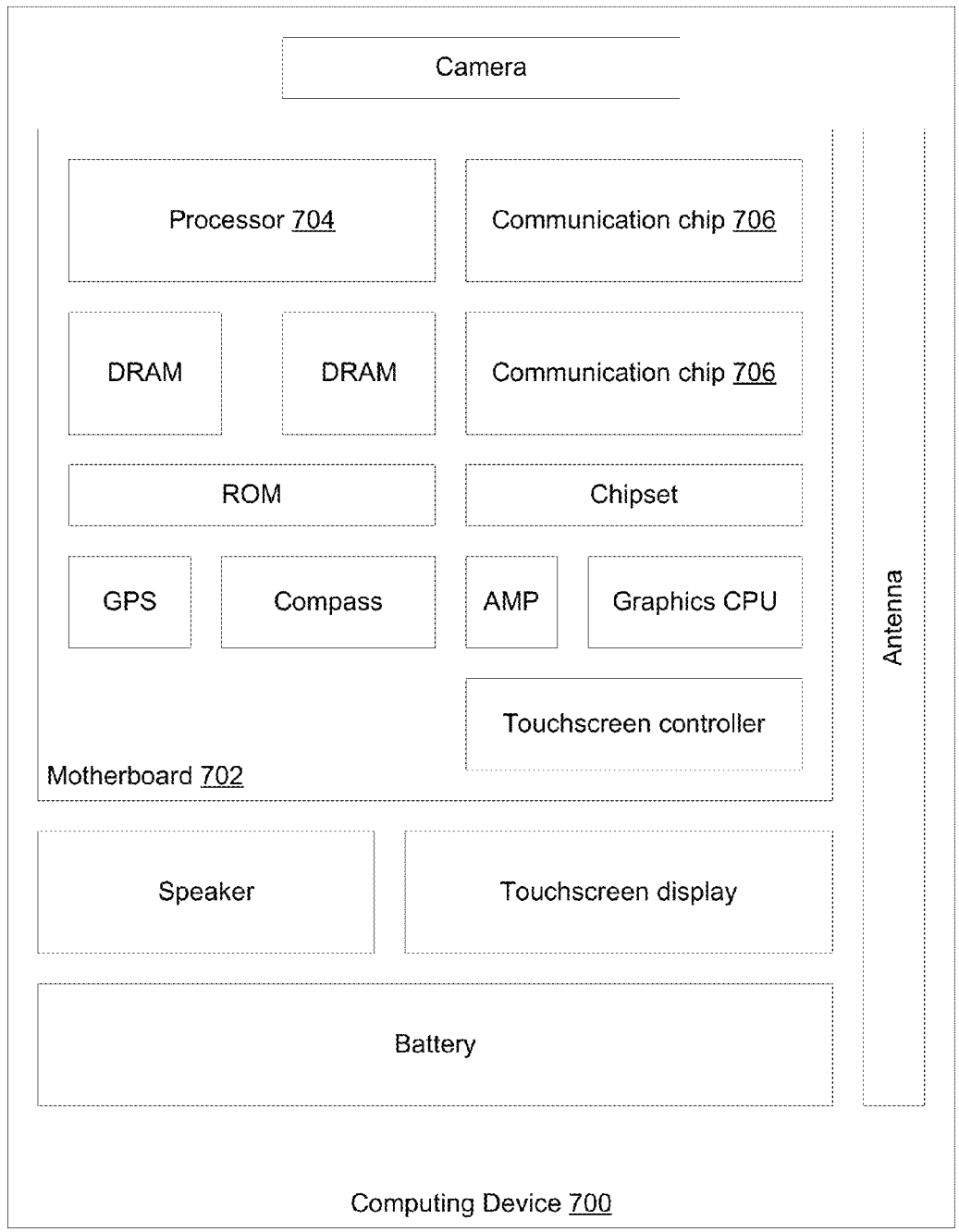
FIG. 7 is a high-level functional block diagram illustrating features of an exemplary computer system, in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
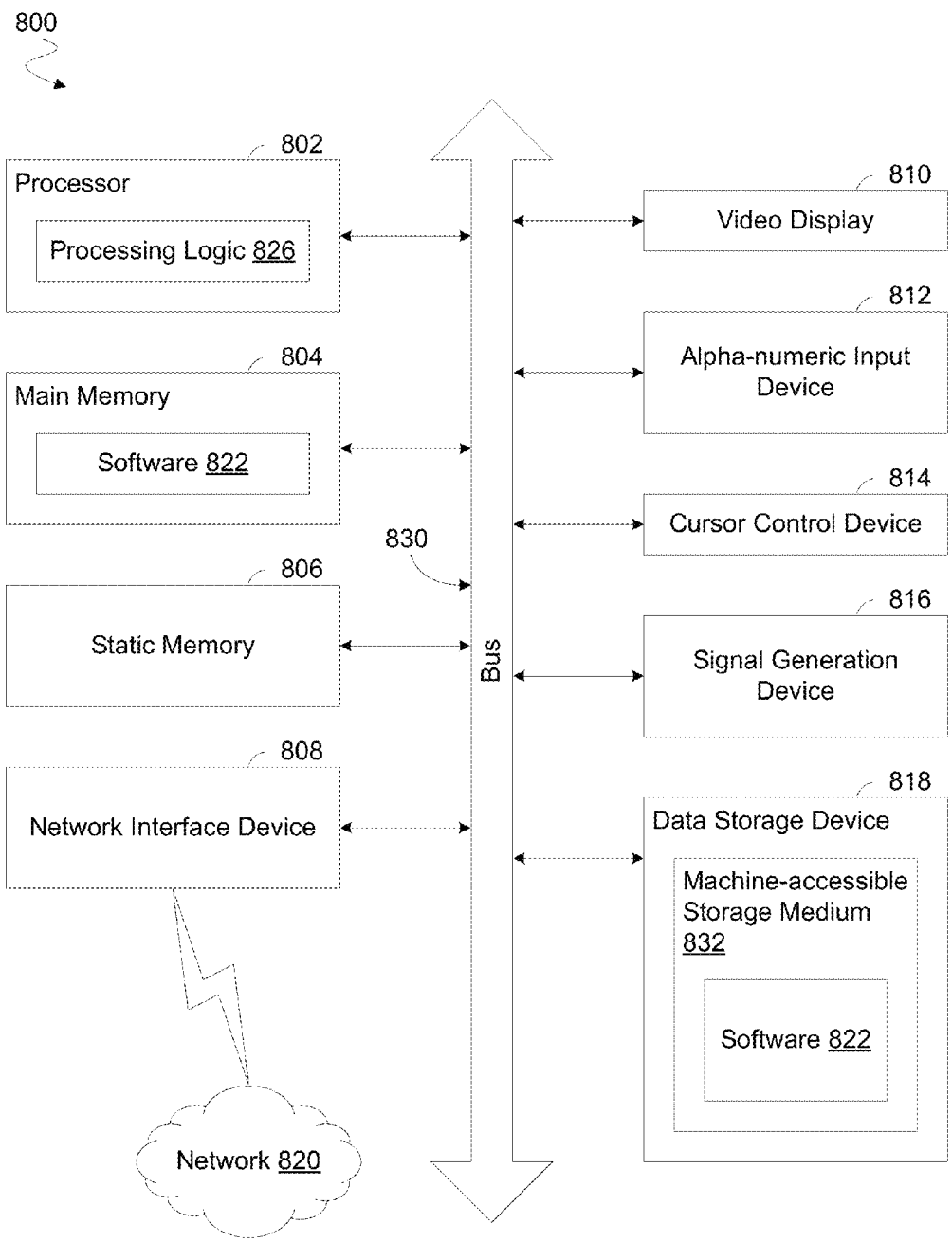
FIG. 8 is a high-level functional block diagram illustrating features of a computing device built in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device comprises a hardware interface including conductive contacts arranged as an array of nodes, the array comprising a plurality of cells each having a cell pattern including eight data bit (B) nodes, four strobe (S) nodes, and ground (G) nodes, wherein a first column at a first side of the cell pattern includes a first node-contiguous group of three or more G nodes of the cell pattern, wherein a first row at a second side of the cell pattern includes a second node-contiguous group of three or more G nodes of the cell pattern, wherein, for each column of the cell pattern, the column includes a G node that, of the nodes of the column, is closest, column-wise, to the first row, and wherein each B node of the cell pattern is row-adjacent or column-adjacent to at least one respective S node of the cell pattern.

In one embodiment, columns of the array each extend in a first line of direction corresponding to a first node periodicity equal to a smallest node periodicity corresponding to any line that extends through the array. In another embodiment, rows of the array each extend in a second line of direction corresponding to a second node periodicity equal to the smallest node periodicity or equal to a second smallest node periodicity corresponding to any line that extends through the array. In another embodiment, a total number of S-B node pairs of the cell pattern is twelve or more, wherein any S-B node pair includes a node-adjacent group of one respective S node and one respective B node. In another embodiment, a ratio of a first value to a second value is 12:8 or more, wherein the first value is a sum of all S nodes of the cell pattern and all B nodes of the cell pattern, and wherein the second value is a total number of G nodes of the cell pattern. In another embodiment, rows of the array are oblique to columns of the array.

In another embodiment, the cell pattern spans a sequence of six adjacent rows r1, r2, r3, r4, r5, r6 and further spans a sequence of four adjacent columns c1, c2, c3, c4, wherein the eight B nodes include nodes (r2, c2), (r3, c2), (r4, c2), (r5, c2), (r3, c4), (r4, c4), (r5, c4), (r6, c4), wherein the four S nodes include nodes (r2, c3), (r3, c3), (r5, c3), (r6, c3), and wherein the G nodes of the cell pattern include nodes (r1, c1), (r2, c1), (r3, c1), (r4, c1), (r1, c2), (r1, c3), (r4, c3), (r2, c4). In another embodiment, the cell pattern spans a sequence of five adjacent rows r1, r2, r3, r4, r5 and further spans a sequence of six adjacent columns c1, c2, c3, c4, c5, c6, wherein the eight B nodes include nodes (r2, c2), (r3, c2), (r2, c3), (r4, c3), (r3, c5), (r5, c5), (r5, c6), (r4, c6), wherein the four S nodes include nodes (r3, c3), (r3, c4), (r4, c4), (r4, c5), and wherein the G nodes of the cell pattern include nodes (r1, c1), (r2, c1), (r3, c1), (r1, c2), (r1, c3), (r2, c4), (r2, c5), (r3, c6). In another embodiment, the cell pattern spans a sequence of five adjacent rows r1, r2, r3, r4, r5 and further spans a sequence of four adjacent columns c1, c2, c3, c4, wherein the eight B nodes include nodes (r2, c2), (r3, c2), (r4, c2), (r5, c2), (r2, c4), (r3, c4), (r4, c4), (r5, c4), wherein the four S nodes include nodes (r2, c3), (r3, c3), (r4, c3), (r5, c3), and wherein the G nodes of the cell pattern include nodes (r1, c1), (r2, c1), (r3, c1), (r4, c1), (r1, c2), (r1, c3), (r1, c4). In another embodiment, the device includes an integrated circuit chip. In another embodiment, the device includes a packaged device. In another embodiment, the device includes a printed circuit board.

In another implementation, a method comprises coupling a first device to a second device via a hardware interface including conductive contacts arranged as an array of nodes, the array comprising a plurality of cells each having a cell pattern including eight data bit (B) nodes, four strobe (S) nodes, and ground (G) nodes, wherein a first column at a first side of the cell pattern includes a first node-contiguous group of three or more G nodes of the cell pattern, wherein a first row at a second side of the cell pattern includes a second node-contiguous group of three or more G nodes of the cell pattern, wherein, for each column of the cell pattern, the column includes a G node that, of the nodes of the column, is closest, column-wise, to the first row, and wherein each B node of the cell pattern is row-adjacent or column-adjacent to at least one respective S node of the cell pattern, exchanging signals between the first device and the second device via the hardware interface.

In another embodiment, columns of the array each extend in a first line of direction corresponding to a first node periodicity equal to a smallest node periodicity corresponding to any line that extends through the array. In another embodiment, rows of the array each extend in a second line of direction corresponding to a second node periodicity equal to the smallest node periodicity or equal to a second smallest node periodicity corresponding to any line that extends through the array. In another embodiment, a total number of S-B node pairs of the cell pattern is twelve or more, wherein any S-B node pair includes a node-adjacent group of one respective S node and one respective B node. In another embodiment, a ratio of a first value to a second value is 12:8 or more, wherein the first value is a sum of all S nodes of the cell pattern and all B nodes of the cell pattern, and wherein the second value is a total number of G nodes of the cell pattern. In another embodiment, rows of the array are oblique to columns of the array.

In another embodiment, the cell pattern spans a sequence of six adjacent rows r1, r2, r3, r4, r5, r6 and further spans a sequence of four adjacent columns c1, c2, c3, c4, wherein the eight B nodes include nodes (r2, c2), (r3, c2), (r4, c2), (r5, c2), (r3, c4), (r4, c4), (r5, c4), (r6, c4), wherein the four S nodes include nodes (r2, c3), (r3, c3), (r5, c3), (r6, c3), and wherein the G nodes of the cell pattern include nodes (r1, c1), (r2, c1), (r3, c1), (r4, c1), (r1, c2), (r1, c3), (r4, c3), (r2, c4). In another embodiment, the cell pattern spans a sequence of five adjacent rows r1, r2, r3, r4, r5 and further spans a sequence of six adjacent columns c1, c2, c3, c4, c5, c6, wherein the eight B nodes include nodes (r2, c2), (r3, c2), (r2, c3), (r4, c3), (r3, c5), (r5, c5), (r5, c6), (r4, c6), wherein the four S nodes include nodes (r3, c3), (r3, c4), (r4, c4), (r4, c5), and wherein the G nodes of the cell pattern include nodes (r1, c1), (r2, c1), (r3, c1), (r1, c2), (r1, c3), (r2, c4), (r2, c5), (r3, c6). In another embodiment, the cell pattern spans a sequence of five adjacent rows r1, r2, r3, r4, r5 and further spans a sequence of four adjacent columns c1, c2, c3, c4, wherein the eight B nodes include nodes (r2, c2), (r3, c2), (r4, c2), (r5, c2), (r2, c4), (r3, c4), (r4, c4), (r5, c4), wherein the four S nodes include nodes (r2, c3), (r3, c3), (r4, c3), (r5, c3), and wherein the G nodes of the cell pattern include nodes (r1, c1), (r2, c1), (r3, c1), (r4, c1), (r1, c2), (r1, c3), (r1, c4). In another embodiment, one of the first device and the second device includes an integrated circuit chip. In another embodiment, one of the first device and the second device includes a packaged device. In another embodiment, one of the first device and the second device includes a printed circuit board.

In another implementation, a system comprises an integrated circuit (IC) device, a hardware interface including conductive contacts arranged as an array of nodes, the array comprising a plurality of cells each having a cell pattern including eight data bit (B) nodes, four strobe (S) nodes, and ground (G) nodes, wherein a first column at a first side of the cell pattern includes a first node-contiguous group of three or more G nodes of the cell pattern, wherein a first row at a second side of the cell pattern includes a second node-contiguous group of three or more G nodes of the cell pattern, wherein, for each column of the cell pattern, the column includes a G node that, of the nodes of the column, is closest, column-wise, to the first row, and wherein each B node of the cell pattern is row-adjacent or column-adjacent to at least one respective S node of the cell pattern. The system further comprises a display coupled to the IC device, the display to generate an image based on signals exchanged by the IC device via the hardware interface.

In another embodiment, columns of the array each extend in a first line of direction corresponding to a first node periodicity equal to a smallest node periodicity corresponding to any line that extends through the array. In another embodiment, rows of the array each extend in a second line of direction corresponding to a second node periodicity equal to the smallest node periodicity or equal to a second smallest node periodicity corresponding to any line that extends through the array. In another embodiment, a total number of S-B node pairs of the cell pattern is twelve or more, wherein any S-B node pair includes a node-adjacent group of one respective S node and one respective B node In another embodiment, a ratio of a first value to a second value is 12:8 or more, wherein the first value is a sum of all S nodes of the cell pattern and all B nodes of the cell pattern, and wherein the second value is a total number of G nodes of the cell pattern. In another embodiment, rows of the array are oblique to columns of the array.

In another embodiment, the cell pattern spans a sequence of six adjacent rows r1, r2, r3, r4, r5, r6 and further spans a sequence of four adjacent columns c1, c2, c3, c4, wherein the eight B nodes include nodes (r2, c2), (r3, c2), (r4, c2), (r5, c2), (r3, c4), (r4, c4), (r5, c4), (r6, c4), wherein the four S nodes include nodes (r2, c3), (r3, c3), (r5, c3), (r6, c3), and wherein the G nodes of the cell pattern include nodes (r1, c1), (r2, c1), (r3, c1), (r4, c1), (r1, c2), (r1, c3), (r4, c3), (r2, c4). In another embodiment, the cell pattern spans a sequence of five adjacent rows r1, r2, r3, r4, r5 and further spans a sequence of six adjacent columns c1, c2, c3, c4, c5, c6, wherein the eight B nodes include nodes (r2, c2), (r3, c2), (r2, c3), (r4, c3), (r3, c5), (r5, c5), (r5, c6), (r4, c6), wherein the four S nodes include nodes (r3, c3), (r3, c4), (r4, c4), (r4, c5), and wherein the G nodes of the cell pattern include nodes (r1, c1), (r2, c1), (r3, c1), (r1, c2), (r1, c3), (r2, c4), (r2, c5), (r3, c6). In another embodiment, the cell pattern spans a sequence of five adjacent rows r1, r2, r3, r4, r5 and further spans a sequence of four adjacent columns c1, c2, c3, c4, wherein the eight B nodes include nodes (r2, c2), (r3, c2), (r4, c2), (r5, c2), (r2, c4), (r3, c4), (r4, c4), (r5, c4), wherein the four S nodes include nodes (r2, c3), (r3, c3), (r4, c3), (r5, c3), and wherein the G nodes of the cell pattern include nodes (r1, c1), (r2, c1), (r3, c1), (r4, c1), (r1, c2), (r1, c3), (r1, c4). In another embodiment, the IC device includes an integrated circuit chip. In another embodiment, the IC device includes a packaged device.

Techniques and architectures for providing connectivity of integrated circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
    a hardware interface including conductive contacts arranged as an array of nodes, the array comprising a plurality of cells each having a cell pattern including:
    eight data bit (B) nodes;
    four strobe (S) nodes; and
    ground (G) nodes;
    wherein a first column at a first side of the cell pattern includes a first node-contiguous group of three or more G nodes of the cell pattern, wherein a first row at a second side of the cell pattern includes a second node-contiguous group of three or more G nodes of the cell pattern;
    wherein, for each column of the cell pattern, the column includes a G node that, of the nodes of the column, is closest, column-wise, to the first row; and
    wherein each B node of the cell pattern is row-adjacent or column-adjacent to at least one respective S node of the cell pattern.

2. The device of claim 1, wherein a total number of S-B node pairs of the cell pattern is twelve or more, wherein any S-B node pair includes a node-adjacent group of one respective S node and one respective B node.

3. The device of claim 1, wherein, a ratio of a first value to a second value is 12:8 or more, wherein the first value is a sum of all S nodes of the cell pattern and all B nodes of the cell pattern, and wherein the second value is a total number of G nodes of the cell pattern.

4. The device of claim 1, wherein rows of the array are oblique to columns of the array.

5. The device of claim 1, wherein the cell pattern spans a sequence of six adjacent rows r1, r2, r3, r4, r5, r6 and further spans a sequence of four adjacent columns c1, c2, c3, c4;
    wherein the eight B nodes include nodes (r2, c2), (r3, c2), (r4, c2), (r5, c2), (r3, c4), (r4, c4), (r5, c4), (r6, c4);
    wherein the four S nodes include nodes (r2, c3), (r3, c3), (r5, c3), (r6, c3); and
    wherein the G nodes of the cell pattern include nodes (r1, c1), (r2, c1), (r3, c1), (r4, c1), (r1, c2), (r1, c3), (r4, c3), (r2, c4).

6. The device of claim 1, wherein the cell pattern spans a sequence of five adjacent rows r1, r2, r3, r4, r5 and further spans a sequence of six adjacent columns c1, c2, c3, c4, c5, c6;
    wherein the eight B nodes include nodes (r2, c2), (r3, c2), (r2, c3), (r4, c3), (r3, c5), (r5, c5), (r5, c6), (r4, c6);
    wherein the four S nodes include nodes (r3, c3), (r3, c4), (r4, c4), (r4, c5); and
    wherein the G nodes of the cell pattern include nodes (r1, c1), (r2, c1), (r3, c1), (r1, c2), (r1, c3), (r2, c4), (r2, c5), (r3, c6).

7. The device of claim 1, wherein the cell pattern spans a sequence of five adjacent rows r1, r2, r3, r4, r5 and further spans a sequence of four adjacent columns c1, c2, c3, c4;
    wherein the eight B nodes include nodes (r2, c2), (r3, c2), (r4, c2), (r5, c2), (r2, c4), (r3, c4), (r4, c4), (r5, c4)
    wherein the four S nodes include nodes (r2, c3), (r3, c3), (r4, c3), (r5, c3); and
    wherein the G nodes of the cell pattern include nodes (r1, c1), (r2, c1), (r3, c1), (r4, c1), (r1, c2), (r1, c3), (r1, c4).

8. The device of claim 1, wherein the device includes an integrated circuit chip.

9. The device of claim 1, wherein the device includes a printed circuit board.

10. A method comprising:
    coupling a first device to a second device via a hardware interface including conductive contacts arranged as an array of nodes, the array comprising a plurality of cells each having a cell pattern including:
    eight data bit (B) nodes;
    four strobe (S) nodes; and
    ground (G) nodes;
    wherein a first column at a first side of the cell pattern includes a first node-contiguous group of three or more G nodes of the cell pattern, wherein a first row at a second side of the cell pattern includes a second node-contiguous group of three or more G nodes of the cell pattern;
    wherein, for each column of the cell pattern, the column includes a G node that, of the nodes of the column, is closest, column-wise, to the first row; and
    wherein each B node of the cell pattern is row-adjacent or column-adjacent to at least one respective S node of the cell pattern;
    exchanging signals between the first device and the second device via the hardware interface.

11. The method of claim 10, wherein a total number of S-B node pairs of the cell pattern is twelve or more, wherein any S-B node pair includes a node-adjacent group of one respective S node and one respective B node.

12. The method of claim 10, wherein, a ratio of a first value to a second value is 12:8 or more, wherein the first value is a sum of all S nodes of the cell pattern and all B nodes of the cell pattern, and wherein the second value is a total number of G nodes of the cell pattern.

13. The method of claim 10, wherein the cell pattern spans a sequence of six adjacent rows r1, r2, r3, r4, r5, r6 and further spans a sequence of four adjacent columns c1, c2, c3, c4;
    wherein the eight B nodes include nodes (r2, c2), (r3, c2), (r4, c2), (r5, c2), (r3, c4), (r4, c4), (r5, c4), (r6, c4);
    wherein the four S nodes include nodes (r2, c3), (r3, c3), (r5, c3), (r6, c3); and
    wherein the G nodes of the cell pattern include nodes (r1, c1), (r2, c1), (r3, c1), (r4, c1), (r1, c2), (r1, c3), (r4, c3), (r2, c4).

14. The method of claim 10, wherein the cell pattern spans a sequence of five adjacent rows r1, r2, r3, r4, r5 and further spans a sequence of six adjacent columns c1, c2, c3, c4, c5, c6;
    wherein the eight B nodes include nodes (r2, c2), (r3, c2), (r2, c3), (r4, c3), (r3, c5), (r5, c5), (r5, c6), (r4, c6);
    wherein the four S nodes include nodes (r3, c3), (r3, c4), (r4, c4), (r4, c5); and
    wherein the G nodes of the cell pattern include nodes (r1, c1), (r2, c1), (r3, c1), (r1, c2), (r1, c3), (r2, c4), (r2, c5), (r3, c6).

15. The method of claim 10, wherein the cell pattern spans a sequence of five adjacent rows r1, r2, r3, r4, r5 and further spans a sequence of four adjacent columns c1, c2, c3, c4;
    wherein the eight B nodes include nodes (r2, c2), (r3, c2), (r4, c2), (r5, c2), (r2, c4), (r3, c4), (r4, c4), (r5, c4)
    wherein the four S nodes include nodes (r2, c3), (r3, c3), (r4, c3), (r5, c3); and
    wherein the G nodes of the cell pattern include nodes (r1, c1), (r2, c1), (r3, c1), (r4, c1), (r1, c2), (r1, c3), (r1, c4).

16. A system comprising:
    an integrated circuit (IC) device;
    a hardware interface including conductive contacts arranged as an array of nodes, the array comprising a plurality of cells each having a cell pattern including:

eight data bit (B) nodes;
four strobe (S) nodes; and
ground (G) nodes;
  wherein a first column at a first side of the cell pattern includes a first node-contiguous group of three or more G nodes of the cell pattern, wherein a first row at a second side of the cell pattern includes a second node-contiguous group of three or more G nodes of the cell pattern;
  wherein, for each column of the cell pattern, the column includes a G node that, of the nodes of the column, is closest, column-wise, to the first row; and
  wherein each B node of the cell pattern is row-adjacent or column-adjacent to at least one respective S node of the cell pattern; and
a display coupled to the IC device, the display to generate an image based on signals exchanged by the IC device via the hardware interface.

17. The system of claim 16, wherein a total number of S-B node pairs of the cell pattern is twelve or more, wherein any S-B node pair includes a node-adjacent group of one respective S node and one respective B node.

18. The system of claim 16, wherein, a ratio of a first value to a second value is 12:8 or more, wherein the first value is a sum of all S nodes of the cell pattern and all B nodes of the cell pattern, and wherein the second value is a total number of G nodes of the cell pattern.

* * * * *